(12) United States Patent
Kimmel

(10) Patent No.: US 6,272,739 B1
(45) Date of Patent: Aug. 14, 2001

(54) DUAL IN-LINE PACKAGE PIN INSERTION AND REMOVAL APPARATUS

(75) Inventor: Gary M. Kimmel, Cressona, PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/444,098

(22) Filed: Nov. 22, 1999

(51) Int. Cl.[7] .................................................. B23P 19/00
(52) U.S. Cl. .............................. 29/764; 29/762; 29/729; 29/758; 29/251; 29/281.3
(58) Field of Search ............................. 29/741, 764, 762, 29/729, 251, 281.1, 283, 758, 281.3

(56) References Cited

U.S. PATENT DOCUMENTS

| | | | |
|---|---|---|---|
| 4,031,603 | * | 6/1977 | Shultz ........................................ 29/265 |
| 4,207,665 | * | 6/1980 | Kurek ......................................... 29/270 |
| 4,521,959 | * | 6/1985 | Sprenkle .................................... 29/741 |
| 4,583,287 | * | 4/1986 | Mc Devitt et al. ........................ 29/741 |
| 4,672,731 | * | 6/1987 | Taylor ........................................ 29/259 |
| 4,868,975 | * | 9/1989 | Zaremba et al. .......................... 29/741 |
| 4,965,923 | * | 10/1990 | Kumazawa ............................. 29/566.3 |
| 5,282,303 | * | 2/1994 | Schriever ............................... 29/432.1 |
| 5,692,437 | * | 12/1997 | Tabain ...................................... 100/231 |

* cited by examiner

*Primary Examiner*—Lee Young
*Assistant Examiner*—Minh Trinh
(74) *Attorney, Agent, or Firm*—Steve Mendelsohn

(57) ABSTRACT

In handling electronic components during manufacturing or other processing, circuit devices are retained within a dual in-line processing (DIP) tube by inserting and securing DIP pins at each end of the DIP tube. The DIP pin apparatus inserts DIP pins into holes of DIP tubes by pressing a DIP pin positioned within a lower slot of a lower plate of the apparatus into a hole of a DIP tube. The DIP pin apparatus removes DIP pins from the holes of DIP tubes by lifting a DIP pin from under its head and removing the DIP pin from the DIP tube. By using the DIP pin apparatus in the handling of electronic components, the adverse effects of operator fatigue, component damage, and production inefficiencies are reduced.

15 Claims, 4 Drawing Sheets

DUAL IN-LINE PACKAGE PIN INSERTION AND REMOVAL APPARATUS

BACKGROUND OF THE INVENTION

1. Field of the Invention

The present invention relates to an apparatus used in the handling of electronic components during manufacturing or other processing.

2. Description of the Related Art

Integrated circuit devices are often transported from one location to another in a plastic tube referred to as a dual in-line package (DIP) tube.

FIG. 1 shows a DIP tube 100 carrying integrated circuit devices 110 and two DIP pins 120. The DIP tube 100 has two holes 130, 140. One DIP pin is shown fully inserted within one hole 130 of the tube, and the other DIP pin is positioned for insertion into the other hole 140 of the tube.

FIG. 2 shows a plastic DIP pin 120 having a head 200, a stem 210, and a semi-rigid loop base 220. The loop base 220 is flexible enough such that the loop base may be positioned into a DIP tube hole whose diameter is smaller than the loop base width 230 of the DIP pin 120 without breaking, cracking, or permanently deforming the loop base 220 of the DIP pin 120. Once inserted, the loop base reforms to its original shape and the DIP pin remains inserted until it is forcibly removed from the hole of the DIP tube by pulling upwards on the head 200 of the DIP pin.

Typically, a removable DIP pin is first inserted into a DIP tube hole on one end of the DIP tube. Then, an operator inserts one or more integrated circuit devices into the open end of the DIP tube which is devoid of a DIP pin. Next, once the operator has completed inserting the circuit devices into the DIP tube, a second removable DIP pin is inserted into the hole at the open end of the DIP tube. The DIP pins at both ends of the DIP tube retain the circuit devices within the DIP tube. The circuit devices in the DIP tube may then be transported by moving the DIP tube from one location to another. The circuit devices may then be removed from the DIP tube by removing at least one of the DIP pins and sliding the circuit devices out of the DIP tube. The process of inserting and removing DIP pins into and from DIP tubes is typically performed manually many hundreds of times a day by any single operator.

To insert a DIP pin into a hole, a DIP pin is positioned over the hole and downward pressure is then applied to the head of the DIP pin to force the loop base to temporarily deform such that the DIP pin may be inserted into the hole. Due to the small size of the DIP pin and the DIP tube hole, it is often difficult for operators to adequately align the DIP pin with the DIP tube hole and concurrently apply pressure to securely insert the DIP pin. Typically, an operator first aligns the DIP pin with the DIP tube hole by manually aligning the DIP pin over the DIP tube hole. The operator uses one hand to hold the DIP pin at the DIP tube hole by "pinching" the DIP pin with his fingers or by using tweezers. Then the operator grasps a block or other tool in his other hand and hammers the DIP pin into the DIP tube hole. Such a maneuver may cause damage to the DIP pin, the DIP tube, and/or circuit devices within the DIP tube, any one of which will cause delays in the processing cycle.

An operator may remove a DIP pin from a DIP tube hole by manually pulling on the DIP pin head. Typically, an operator removes a DIP pin from a DIP tube hole by holding the DIP tube in place with one hand and placing his fingernails of the other hand under the DIP pin head and pulling upward. In other situations, an operator may use pliers, or a similar grasping tool, to grasp the DIP pin head before pulling upward and away from the DIP tube. In each situation, the operator needs to exert enough force on the DIP pin to enable the semi-rigid loop base to deform and pass through the DIP tube hole. In exerting such force, the operator may be caught "off-guard" when the DIP pin is completely removed from the DIP tube hole such that circuit devices are accidentally spilled from the tube and damaged. Additionally, operators often break their fingernails, the DIP tube, or may damage or lose the DIP pin during such a maneuver. The results of these removal actions, likewise, cause delays in the processing cycle.

SUMMARY OF THE INVENTION

The present invention is directed to an apparatus which resolves the problems of delays in the processing cycle that are caused by an operator forcibly inserting or removing DIP pins into or from DIP tubes. The invention provides an operator a tool with which the operator can apply an downward or an upward force on a DIP pin to insert or remove the DIP pin into or from a DIP tube hole without damaging the DIP pin, DIP tube, or circuit devices inside the DIP tube.

In one embodiment, the present invention comprises an apparatus for inserting a DIP pin into a hole in a DIP tube and for removing the DIP pin from the hole in the DIP tube, wherein the DIP pin has a head and a loop interconnected by a stem. The apparatus comprises a frame, a rod slidably connected to the frame, and a lever pivotally connected to the frame such that pivoting the lever with respect to the frame causes the rod to slide with respect to the frame. A lower end of the rod of the apparatus has an extension having a lower plate with a slot extending to an edge of the plate, the lower plate defines a clearance with respect to the lower end of the rod, the height of the clearance is greater than the thickness of the head of the DIP pin, and the slot is wider than the stem of DIP pin and narrower than the head of the DIP pin, such that the DIP pin can be configured onto the extension, whether or not the DIP pin is already inserted into the DIP tube, by sliding the stem of the DIP pin into the slot in the lower plate of the extension with (1) the head of the DIP pin positioned above the lower plate and within the clearance between the lower plate and the lower end of the rod and (2) the loop of the DIP pin below the lower plate.

In another embodiment, the present invention comprises an attachment to configure a device to function as an apparatus for inserting a DIP pin into a hole in a DIP tube and for removing the DIP pin from the hole in the DIP tube, wherein: the DIP pin has a head and a loop interconnected by a stem; the device has a frame, a rod slidably connected to the frame, and a lever pivotally connected to the frame such that pivoting the lever with respect to the frame causes the rod to slide with respect to the frame; and the attachment comprises a lower plate with a slot extending to an edge of the plate, such that, when the attachment is configured onto a lower end of the rod, the attachment forms an extension at the lower end of the rod, wherein: the lower plate defines a clearance with respect to the lower end of the rod, wherein the height of the clearance is greater than the thickness of the head of the DIP pin; and the slot is wider than the stem of DIP pin and narrower than the head of the DIP pin, such that: the DIP pin can be configured onto the extension, whether or not the DIP pin is already inserted into the DIP tube, by sliding the stem of the DIP pin into the slot in the lower plate of the extension with (1) the head of the DIP pin positioned above the lower plate and within the clearance between the lower plate and the lower end of the rod and (2) the loop of the DIP pin below the lower plate.

As used herein, the term "punch-tool" includes devices such as minitools, ink and dye press tools, pressure printing devices, leather hole-punching tools, and the like. A punch-tool, as defined herein, is a device having a movable rod configured by levers or gears to enable an operator to manually pull or push a levered arm of the punch-tool such that the rod of the punch-tool exerts a greater force than that applied to the levered arm by the operator. The lower end of the movable rod of the punch-tool is configured or adapted to be configured to accept a mateable connector or bracket of the present invention.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
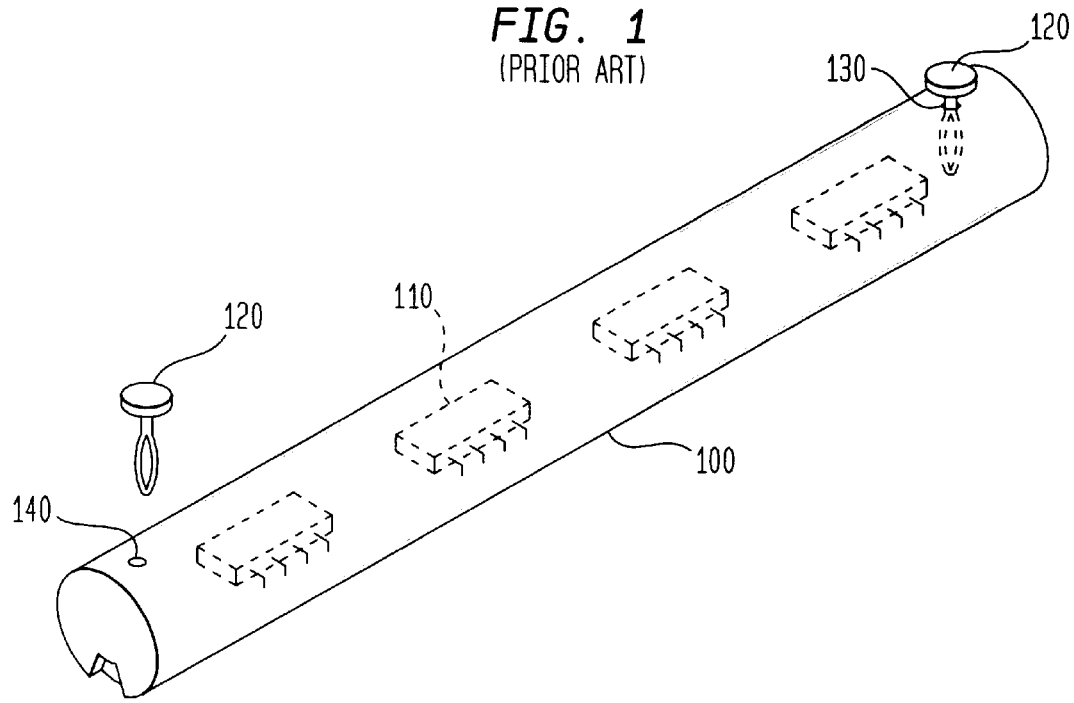
FIG. 1 shows a DIP tube carrying integrated circuit devices and two DIP pins.
Figure 2:
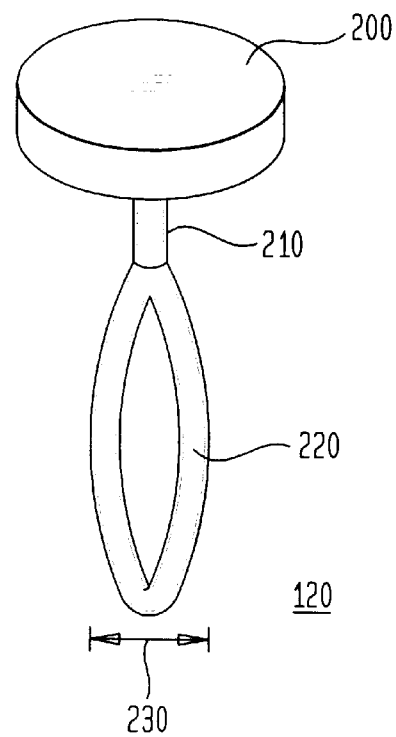
FIG. 2 shows a plastic DIP pin having a head, a stem, and a semi-rigid loop base.
Figure 3:
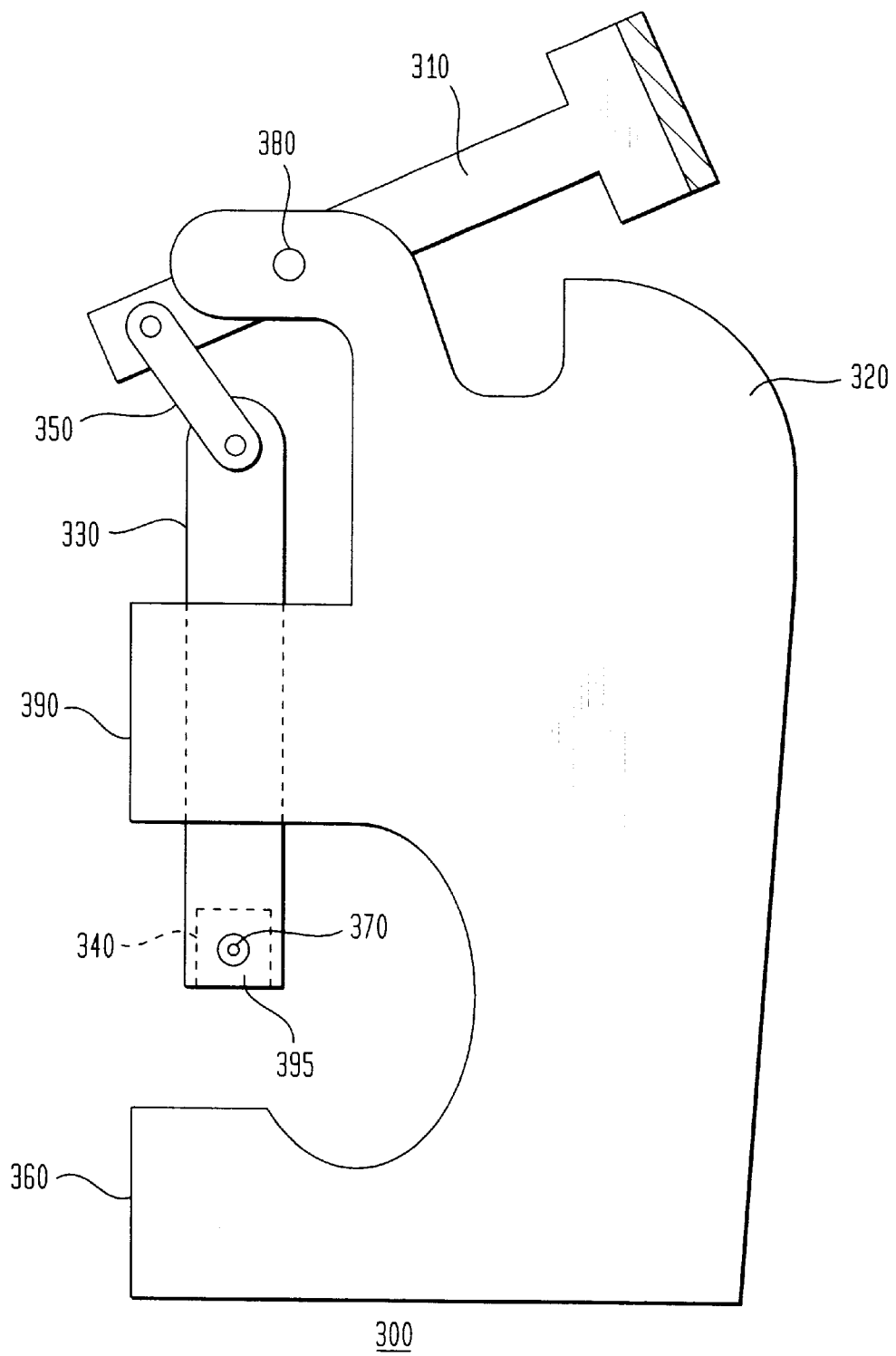
FIG. 3 shows a conventional punch-tool.

FIG. 3 shows a conventional punch-tool 300. The punch-tool 300 has a lever arm 310, a body 320, a rod 330 having a lower end 340 with a hole and a set screw 370, and a mounting base 360, wherein the arm 310 is connected with the rod 330 by a linkage 350. The rod 330 is configured with the arm 310 such that the rod 330 moves downward or upward within the sleeve 390 in relation to the distance the arm 310 is rotated about a pivot point 380. The lower end 340 of the rod 330 has an inner opening 395 which is configured to receive the other devices (not shown).

Figure 4:
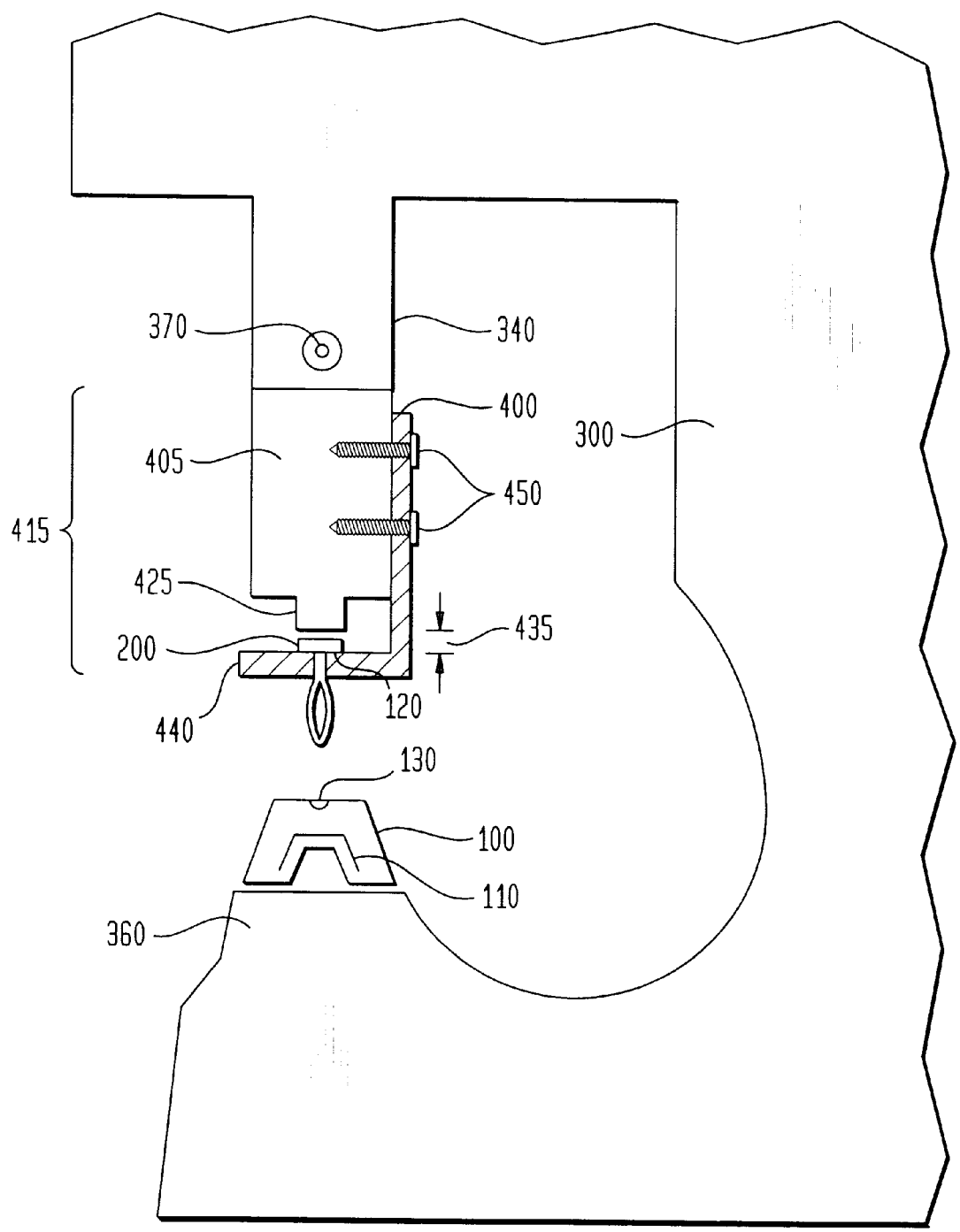
FIG. 4 shows a bracket mated with a connector creating an assembly and the assembly secured with a punch-tool, according to one embodiment of the present invention.

FIG. 4 shows a bracket 400 mated with a connector 405 creating an assembly 415 that is secured with a punch-tool 300, according to one embodiment of the present invention. The bracket 400 is preferably secured to the connector 405 by two screws 450, although other securing devices such as bolts, clamps, and the like are possible. The bracket 400 is mounted such that the lower plate 440 is positioned directly under the base 425 of the connector 405. The bracket 400 may be adjusted upward or downward to ensure that the clearance 435 between the base 425 of the connector 405 and the lower plate 440 of the bracket 400 is slightly greater than the thickness of a DIP pin head 200. Additionally, for a left-handed operator, the connector 405 may be rotated 180 degrees such that the operator is able to position the assembly accurately. Further, a DIP tube 100 is shown positioned into place on the mounting base 360 of the punch-tool 300, and a DIP pin 120 is shown positioned in the lower plate 440 of the bracket 400.

The embodiment shown in FIG. 4 shows a configuration of the present invention in which an existing punch-tool is modified for the present application. Other devices, such as a unique punch-tool or a tool device designed specifically for the present invention may also be used to achieve the same function of the application.

Figure 5:
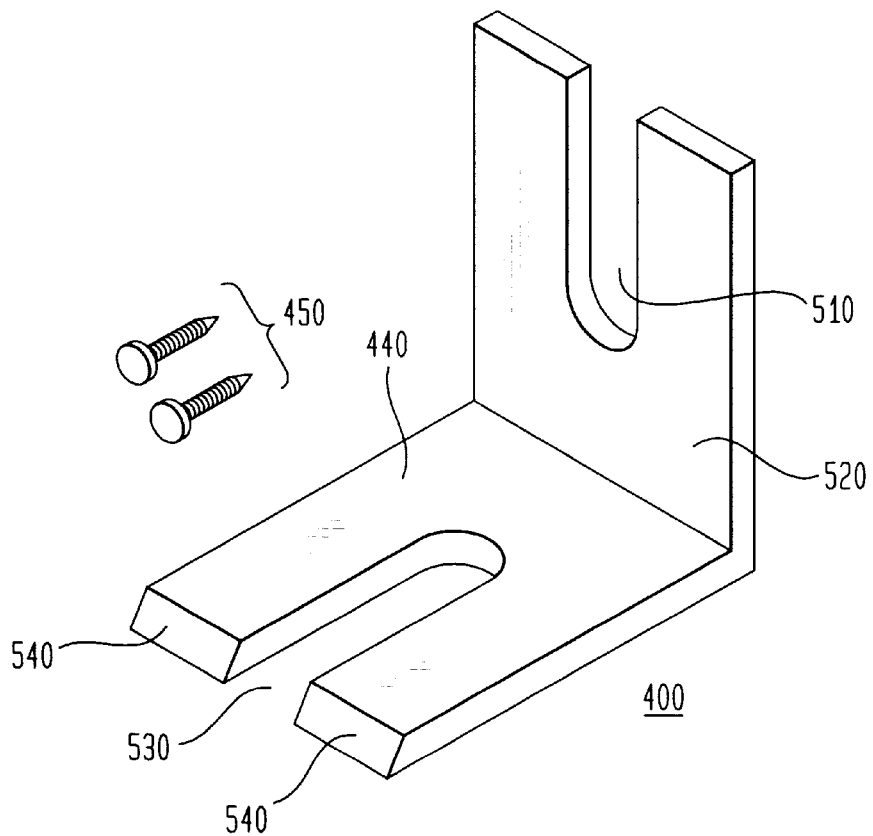
FIG. 5 shows the bracket of FIG. 4.

FIG. 5 shows the bracket 400 of FIG. 4. The bracket 400 has an upper plate 520 with an upper slot 510, and a lower plate 440 with a lower slot 530. The upper slot 510 is for adjustably positioning the bracket 400 onto the connector 405, punch-tool 300 or similar device. The upper slot 510 is configured to receive the screws 450. The lower plate 440 is of a thickness which is thin enough to enable the lower plate 440 to be slidably positioned between an inserted DIP pin head 200 and a DIP tube 100. Preferably, the lower plate 440 has a beveled end 540 which enables the lower plate 440 to be slidably positioned into place between a DIP pin head 200 which has been inserted into a hole 130 of a DIP tube 100, although other configurations are possible. The lower plate 440 of the bracket 400 is preferably perpendicular to the upper plate 520 of the bracket 400 although other configurations are possible. The width of the lower slot 530 is wider than the width of the stem 210 of a DIP pin 120 and narrower than the diameter of the head 200 of a DIP pin 120. Preferably, the bracket 400 is comprised of a metal, such as stainless steel, although any suitable rigid material may be used.

Figure 6:
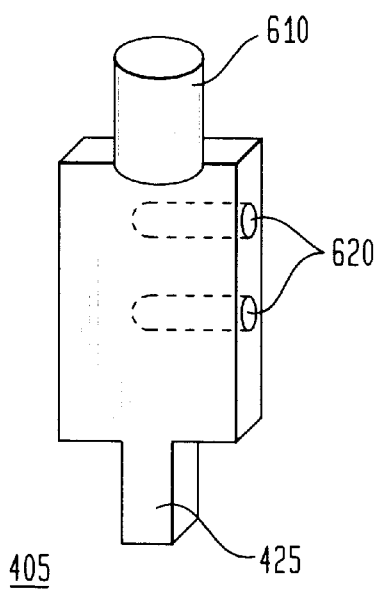
FIG. 6 shows the connector of FIG. 4.

FIG. 6 shows the connector 405 of FIG. 4. The connector 405 has an upper end 610 configured for inserting and mating into the lower end 340 of a punch-tool 300, wherein the connector is secured to the punch-tool by tightening the set screw 370 of the punch-tool. The connector 405 further comprises a plurality of holes 620 for receiving screws 450 that secure the bracket 400 to the connector 405. Preferably, the connector is comprised of a metal, such as stainless steel, but may be comprised of any suitable rigid or semi-rigid material.

In one particular implementation, for inserting a DIP pin 120 into a DIP tube hole 130, an operator positions the upper end 610 of the connector 405 into the lower end 340 of the punch-tool 300 and secures the connector 405 to the punch-tool 300 by tightening the set screw 370. The operator then positions the screws 450 into the holes 620 of the connector 405 and partially tightens the screws 450. Alternatively, the operator may position the screws 450 into the holes 620 of the connector 405 prior to inserting the connector 405 into the lower end 340 of the punch-tool 300. The operator then slides the upper plate 520 of the bracket 400 onto the connector 405 such that the upper slot 510 of the bracket 400 receives the screws 450. The operator then adjusts the clearance 435 such that the clearance is slightly greater than the thickness of a DIP pin head 200. The operator then tightens the screws 450 and secures the bracket 400 into position on the connector 405, creating the assembly 415.

A DIP pin 120 is then inserted into the lower slot 530 of the assembly 415 such that the DIP pin head 200 is positioned under the base 425 of the assembly 415. The operator then positions a DIP tube 100 onto the mounting base 360 of the punch-tool 300, and aligns a hole 130 of the DIP tube with the loop base 220 of the positioned DIP pin 120. The operator then pulls the punch-tool arm 310 to cause the assembly 415 to move downward and press the loop base 220 into the DIP tube hole 130. The compression force exerted by the assembly 415 causes the DIP pin 120 to be inserted into the DIP tube hole 130.

To remove a DIP pin 120 which is inserted into a DIP tube hole 130, an operator first aligns and mounts the bracket 400 and connector 405 with the punch-tool 300 in a manner similar to that stated previously to create an assembly 415 having a clearance 435 slightly greater than the thickness of a DIP pin head 200.

The operator then positions a DIP tube 100 having a DIP pin 120 inserted therein onto the mounting base 360 of the punch-tool 300. The operator then pulls the punch-tool arm 310 to cause the assembly 415 to move downward towards the DIP tube 100. The operator then maneuvers the DIP tube 100 in relation to the assembly 415 to cause the lower slot 530 of the lower plate 440 of the assembly 415 to receive the DIP pin 120 and therefore be positioned between the DIP pin head 200 and the DIP tube 100. The operator then positions the DIP tube 100 to be positioned onto the mounting base 360 and concurrently adjusts the punch-tool arm 310 to maintain the position of the lower plate 440 between the DIP pin head 200 and the DIP tube 100. The operator then secures the DIP tube 100 into place on the mounting plate 360 by holding, strapping, clamping, or using another suitable securing method, and adjusts the punch-tool arm 310 such that the assembly 415 moves upwards and away from the secured DIP tube 100. The tension force exerted by the assembly 415 causes the DIP pin 120 to be removed from the DIP tube hole 130.

By way of example and not of limitation, for a DIP pin 120 having a total length of about 0.625 inches, a stem 210 diameter of about 0.095 inches, a DIP pin head 200 thickness of about 0.0625 inches, and a DIP pin head 200 diameter of about 0.25 inches, preferably the thickness of the lower plate 440 is about 0.03 inches, the width of the lower slot 530 is about 0.10 inches and the clearance 435 between the lower plate 440 and the connector base 425 is at least about 0.065 inches.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An apparatus for inserting a DIP pin into a hole in a DIP tube and for removing the DIP pin from the hole in the DIP tube, wherein the DIP pin has a head and a loop interconnected by a stem, the apparatus comprising:
    (a) a frame;
    (b) a rod slidably connected to the frame; and
    (c) a lever pivotally connected to the frame such that pivoting the lever with respect to the frame causes the rod to slide with respect to the frame, wherein:
    a lower end of the rod has an extension having a lower plate with a slot extending to an edge of the plate;
    the lower plate defines a clearance with respect to the lower end of the rod, wherein the height of the clearance is greater than the thickness of the head of the DIP pin;
    the slot is wider than the stem of the DIP pin and narrower than the head of the DIP pin;
    the thickness of the lower plate is not more than the length of the stem of the DIP pin; and
    the clearance between the lower end of the rod and the lower plate is large enough to receive the head of the DIP pin, with the stem of the DIP pin positioned within the slot and the loop of the DIP pin positioned below the lower plate, independent of whether the DIP pin is already inserted into the hole in the DIP tube.

2. The invention of claim 1, wherein the extension is adjustably mounted relative to the rod to enable the mounting of the extension to be adjusted to change the height of the clearance between the lower plate and the lower end of the rod.

3. The invention of claim 1, wherein the extension is part of an attachment mounted to the lower end of the rod.

4. The invention of claim 1, wherein:
    the extension is adjustably mounted relative to the rod to enable the mounting of the extension to be adjusted to change the height of the clearance between the lower plate and the lower end of the rod;
    the extension is part of an attachment mounted to the lower end of the rod;
    the frame, the rod, and the lever are part of a punch-tool; and
    the attachment comprises:
        (A) a connector configured to mount the attachment onto the lower end of the rod; and
        (B) a bracket comprising the lower plate and configured to be mounted to the connector to position the lower plate below the lower end of the rod to define the clearance between the lower plate and the lower end of the rod, wherein the bracket is configured to be mounted to the connector at a plurality of positions corresponding to different heights of the clearance.

5. The invention of claim 1, wherein the edge of the plate to which the slot extends is beveled.

6. The invention of claim 3, wherein the frame, the rod, and the lever are part of a punch-tool.

7. The invention of claim 3, wherein the attachment comprises:
    (A) a connector configured to mount the attachment onto the lower end of the rod; and
    (B) a bracket comprising the lower plate and configured to be mounted to the connector to position the lower plate below the lower end of the rod to define the clearance between the lower plate and the lower end of the rod.

8. The invention of claim 7, wherein the bracket is configured to be mounted to the connector at a plurality of positions corresponding to different heights of the clearance.

9. An attachment to configure a device to function as an apparatus for inserting a DIP pin into a hole in a DIP tube and for removing the DIP pin from the hole in the DIP tube, wherein:
    the DIP pin has a head and a loop interconnected by a stem;
    the device has a frame, a rod slidably connected to the frame, and a lever pivotally connected to the frame such that pivoting the lever with respect to the frame causes the rod to slide with respect to the frame; and the attachment comprises a lower plate with a slot extending to an edge of the plate, the attachment being configurable onto a lower end of the rod to form an extension at the lower end of the rod, wherein:
    the lower plate defines a clearance with respect to the lower end of the rod, wherein the height of the clearance is greater than the thickness of the head of the DIP pin;
    the slot is wider than the stem of the DIP pin and narrower than the head of the DIP pin;
    the thickness of the lower plate is not more than the length of the stem of the DIP pin; and
    the clearance between the lower end of the rod and the lower plate is large enough to receive the head of the DIP pin, with the stem of the DIP pin positioned within the slot and the loop of the DIP pin positioned below the lower plate, independent of whether the DIP pin is already inserted into the hole in the DIP tube.

10. The invention of claim 9, wherein the extension is adjustable mounted relative to the rod to enable the mounting of the extension to be adjusted to change the height of the clearance between the lower plate and the lower end of the rod.

11. The invention of claim 9, wherein the device is a punch-tool.

12. The invention of claim 9, wherein the attachment comprises:

(A) a connector configured to mount the attachment onto the lower end of the rod; and (B) a bracket comprising the lower plate and configured to be mounted to the connector to position the lower plate below the lower end of the rod to define the clearance between the lower plate and the lower end of the rod.

13. The invention of claim 9, wherein:

the positioning of is the extension is adjustable mounted relative to the rod to enable the mounting of the extension to be adjusted to change the height of the clearance between the lower plate and the lower end of the rod;

the device is a punch-tool;

the attachment comprises:

(A) a connector configured to mount the attachment onto the lower end of the rod; and (B) a bracket comprising the lower plate and configured to be mounted to the connector to position the lower plate below the lower end of the rod to define the clearance between the lower plate and the lower end of the rod, wherein the bracket is configured to be mounted to the connector at a plurality of positions corresponding to different heights of the clearance.

14. The invention of claim 9, wherein the edge of the plate to which the slot extends is beveled.

15. The invention of claim 12, wherein the bracket is configured to be mounted to the connector at a plurality of positions corresponding to different heights of the clearance.

* * * * *

UNITED STATES PATENT AND TRADEMARK OFFICE
CERTIFICATE OF CORRECTION

PATENT NO. : 6,272,739 B1
DATED : August 14, 2001
INVENTOR(S) : Garry M. Kimmel

It is certified that error appears in the above-identified patent and that said Letters Patent is hereby corrected as shown below:

<u>Column 7,</u>
Line 16, replace "the positioning of is the extension is adjustable" with -- the extension is adjustably --.

Signed and Sealed this

Fourteenth Day of May, 2002

*Attest:*

*Attesting Officer*

JAMES E. ROGAN
*Director of the United States Patent and Trademark Office*